(12) United States Patent
Tudhope et al.

(10) Patent No.: US 11,339,464 B2
(45) Date of Patent: May 24, 2022

(54) PLASMA NITRIDING WITH PECVD COATINGS USING HOLLOW CATHODE ION IMMERSION TECHNOLOGY

(71) Applicant: AGM CONTAINER CONTROLS, INC., Tucson, AZ (US)

(72) Inventors: Andrew Tudhope, Tucson, AZ (US); Thomas B. Casserly, Tucson, AZ (US); Salvatore Gennaro, Tucson, AZ (US)

(73) Assignee: AGM CONTAINER CONTROLS, INC., Tucson, AZ (US)

( * ) Notice: Subject to any disclaimer, the term of this patent is extended or adjusted under 35 U.S.C. 154(b) by 160 days.

(21) Appl. No.: 16/672,202

(22) Filed: Nov. 1, 2019

(65) Prior Publication Data

US 2020/0140988 A1    May 7, 2020

Related U.S. Application Data

(63) Continuation-in-part of application No. 16/499,669, filed as application No. PCT/US2018/025747 on Apr. 2, 2018.

(Continued)

(51) Int. Cl.
*C23C 8/26* (2006.01)
*C23C 8/02* (2006.01)
(Continued)

(52) U.S. Cl.
CPC .............. *C23C 8/26* (2013.01); *C23C 8/02* (2013.01); *C23C 8/80* (2013.01);
(Continued)

(58) Field of Classification Search
CPC .............. H01J 37/32568; H01J 37/32; H01J 37/32403; H01J 37/3244; H01J 37/32394;
(Continued)

(56) References Cited

U.S. PATENT DOCUMENTS 5,527,439 A      8/1996  Sieck et al.
5,587,207 A  *  12/1996  Gorokhovsky ......... C23C 16/02
                                                         118/50

(Continued)

FOREIGN PATENT DOCUMENTS

JP          5822975 B2    10/2015
KR      101519189 B1     5/2015

OTHER PUBLICATIONS

D. Lusk et al.: "Thick DLC films deposited by PECVD on the internal surface of cylindrical substrates" (2008) Science Direct, Diamond and Related Materials, 1613-1621.

(Continued)

*Primary Examiner* — Yuechuan Yu
(74) *Attorney, Agent, or Firm* — Nguyen Tarbet LLC

(57) ABSTRACT

Rapid plasma nitriding is achieved by harnessing the power and increased density of plasma discharges created by hollow cathodes. When opposing surfaces are maintained at the proper voltage, sub atmospheric pressure, and spacing, a phenomenon known as the hollow cathode effect creates additional hot oscillating electrons capable of multiple ionization events thereby increasing the number of ions and electrons per unit volume (plasma density). The present invention describes the harnessing of this phenomenon to rapidly plasma nitride metal surfaces and optionally rapidly deposit functional coatings in a continuous operation for duplex coatings.

17 Claims, 6 Drawing Sheets

Related U.S. Application Data

(60) Provisional application No. 62/754,457, filed on Nov. 1, 2018, provisional application No. 62/479,882, filed on Mar. 31, 2017.

(51) Int. Cl.
*C23C 8/80* (2006.01)
*H05B 7/18* (2006.01)
*H01J 37/32* (2006.01)

(52) U.S. Cl.
CPC .. *H01J 37/32027* (2013.01); *H01J 37/32394* (2013.01); *H01J 37/32899* (2013.01); *H05B 7/18* (2013.01)

(58) Field of Classification Search
CPC ........... H01J 37/32899; H01J 37/32596; H01J 37/32027; H01J 37/3288; H01J 37/32477; C23C 16/503; C23C 16/04
See application file for complete search history.

(56) References Cited

U.S. PATENT DOCUMENTS

| | | | |
|---|---|---|---|
| 6,027,618 A | 2/2000 | Aruga et al. | |
| 6,045,667 A | 4/2000 | Moll | |
| 6,129,856 A | 10/2000 | Jung et al. | |
| 7,300,684 B2 | 11/2007 | Boardman et al. | |
| 7,566,900 B2 | 7/2009 | Le et al. | |
| 8,343,593 B2 | 1/2013 | Boardman et al. | |
| 9,076,991 B2 | 7/2015 | Kurita et al. | |
| 9,230,835 B2 | 1/2016 | Gelatos et al. | |
| 2006/0011468 A1* | 1/2006 | Boardman | C23C 16/503 204/192.12 |
| 2007/0046927 A1 | 3/2007 | Le et al. | |
| 2007/0262059 A1 | 11/2007 | Boardman et al. | |
| 2008/0029494 A1 | 2/2008 | Tudhope et al. | |
| 2010/0173495 A1 | 7/2010 | Thakur et al. | |
| 2010/0276283 A1 | 11/2010 | Muenz et al. | |
| 2012/0064245 A1* | 3/2012 | Coutu | C23C 16/45504 427/248.1 |
| 2013/0146443 A1 | 6/2013 | Papa et al. | |
| 2014/0076718 A1 | 3/2014 | Gorokhovsky et al. | |

OTHER PUBLICATIONS

ASM International, "An Introduction to Nitriding", pp. 1-12, ASM International, Materials Park, Ohio, USA (Year 2003).

Bernal, Andres "Investigation on Nitriding with Emphasis in Plasma Nitriding Process, Current Technology and Equipment" pp. 1-38, Stockholm, (Jan. 2006).

* cited by examiner

PLASMA NITRIDING WITH PECVD COATINGS USING HOLLOW CATHODE ION IMMERSION TECHNOLOGY

CROSS-REFERENCES TO RELATED APPLICATIONS

This application is a non-provisional and claims benefit of U.S. Provisional Application No. 62/754,457 filed Nov. 1, 2018, the specification(s) of which is/are incorporated herein in their entirety by reference.

This application is a continuation-in-part and claims benefit of U.S. patent application Ser. No. 16/499,669 filed Sep. 30, 2019, which is a 371 application of PCT Patent Application No. PCT/US18/25747 filed Apr. 2, 2018, which claims benefit of U.S. Provisional Application No. 62/479,882 filed Mar. 31, 2017, the specification(s) of which is/are incorporated herein in their entirety by reference.

FIELD OF THE INVENTION

The present invention relates to surface enhancements of metal components for improved performance such as increased hardness, protection against wear and corrosion, and decreased friction, leading to longer component lifetime.

BACKGROUND OF THE INVENTION

Nitriding of steels is a thermochemical surface enhancement where nitride compounds are formed through diffusion of atomic nitrogen into the surface at elevated temperatures. Three regions are possible: an outermost layer, a diffusion zone, and a transition zone. In the outermost layer, a brittle white (compound) layer forms as nitride compounds increase in concentration and precipitate from the bulk material creating a dual phase layer. While hard, the white layer is brittle and often rough and porous and should be removed for the best working surface of the tool. This is due to its brittle nature, which can cause it to crack and debond from the bulk under high loads. The diffusion zone is a single phase region containing formed nitrides. The transition zone is the end of the diffusion zone where the concentration of formed nitrides drops rapidly and meets the bulk material which remains unchanged.

Plasma nitriding has been found to overcome the uniformity and difficulty in controlling white (compound) layer formation issues of gas nitriding by controlling the amount of nitrogen at the surface to create bright nitriding which does not have compound layer formation. The low pressure also enhances the uniformity and control of gas concentrations. This bright nitriding process has the advantage of not requiring polishing after processing. Unlike gas nitriding or salt bath nitriding/nitrocarburizing, plasma nitriding is possible at lower temperatures which allows for more control over the type of alloys processed. Plasma nitriding also enables nitriding of aluminum, stainless steels, and other materials with natural protective oxide formation not possible with gas or salt bath nitriding. When plasma nitriding these materials, the oxide layer is first etched, allowing for nitrogen diffusion in the base material. Typically, the time for most plasma nitriding processes is on the order of 6-8 hours. Utilization of hollow cathode ion immersion allows for similar diffusion zone hardness and depth in as little as 30 minutes, dramatically reducing the cost, time, and operating temperature for the material being case hardened.

SUMMARY OF THE INVENTION

Increased plasma density characterized by hollow cathode discharges enables the rapid heating of parts to nitriding temperatures, uniformly dense plasma, and rich ion bombardment of the surface to enhance diffusion of free nitrogen into the surface. Utilizing the deposition systems, such as those described in commonly owned U.S. Pat. No. 7,838,793 and PCT/US2018/025747, the hollow cathode discharge is controlled to perform rapid plasma nitriding. Additionally, the system is capable of creating coatings using vapor deposition also by hollow cathode discharge at radically faster rates than otherwise possible. When desired, the invention can further apply a hard, chemically inert (corrosion resistant), low friction, low wear diamond-like carbon (DLC) coating to the nitrided surface in the same system without passivation or exposure to atmosphere. Duplex plasma nitriding with DLC is only one of the many useful combinations made possible by this invention.

Without wishing to limit the invention to any theory or mechanism, it is believed that this technical feature of the present invention advantageously allows for the ability to perform both nitriding and depositing of functional coatings in the same system without exposure to atmosphere, as would be required with traditional systems for duplex coatings, thereby enhancing the adhesion and quality of the finished workpiece. Continuous duplex processes are superior to sequential duplex processes because the activated surface from the first process is not exposed to atmospheric oxygen, water, or other contaminants prior to the deposition of the working surface coating, for example, by plasma enhanced chemical vapor deposition (PECVD). Furthermore, the systems of the present invention can utilize the same platform without additional modification to enable both rapid nitriding and rapid functional coating deposition at rates of >15 microns/hr, unlike other systems that are comparatively complex and have deposition rates for the functional coating on the order of 1 micron/hour. None of the presently known prior references has the inventive technical features of the present invention.

In some embodiments, this process can be done for internal surfaces of a workpiece by fixturing said workpiece as a vacuum chamber as described in U.S. Pat. No. 7,838,793, "System and Method for treating surfaces of components", the specifications of which are incorporated herein in its entirety by reference. In other embodiments, this process can treat internal or external surfaces by utilization of the system described in PCT/US2018/025747. "Systems and methods for coating surfaces", the specifications of which are incorporated herein in its entirety by reference. In still other embodiments, the same system can treat both internal and external surfaces.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE DRAWINGS

The features and advantages of the present invention will become apparent from a consideration of the following detailed description presented in connection with the accompanying drawings in which.

DESCRIPTION OF PREFERRED EMBODIMENTS

Figure 1:
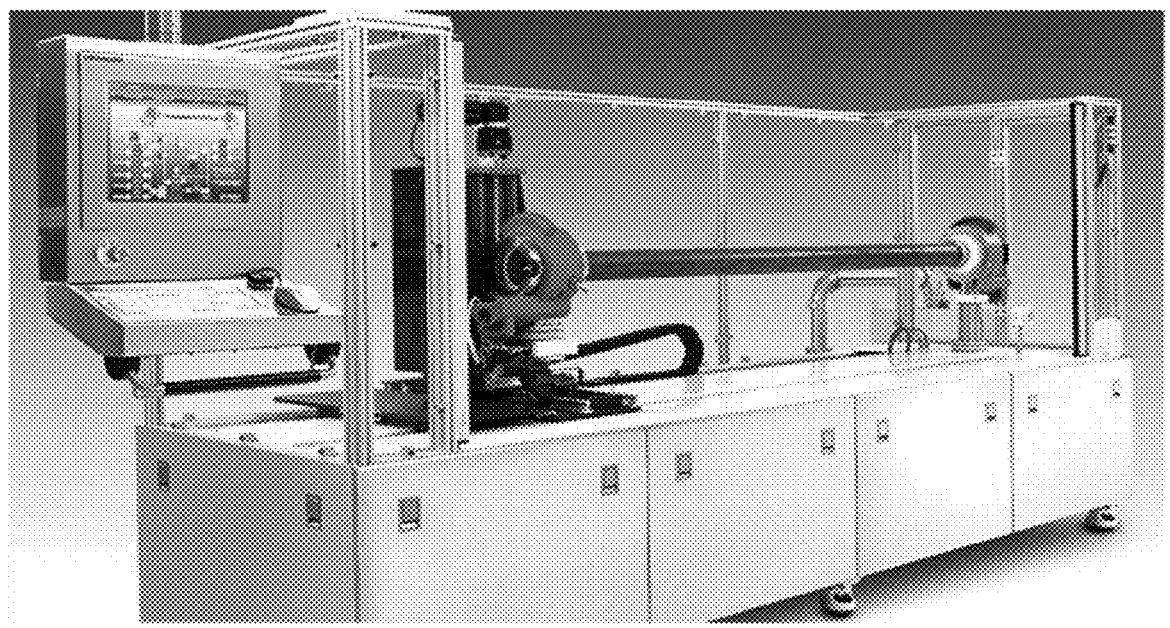
FIG. 1 shows one embodiment of a deposition system that can perform duplex plasma nitriding and coating onto an interior surface of a workpiece.
Figure 2:
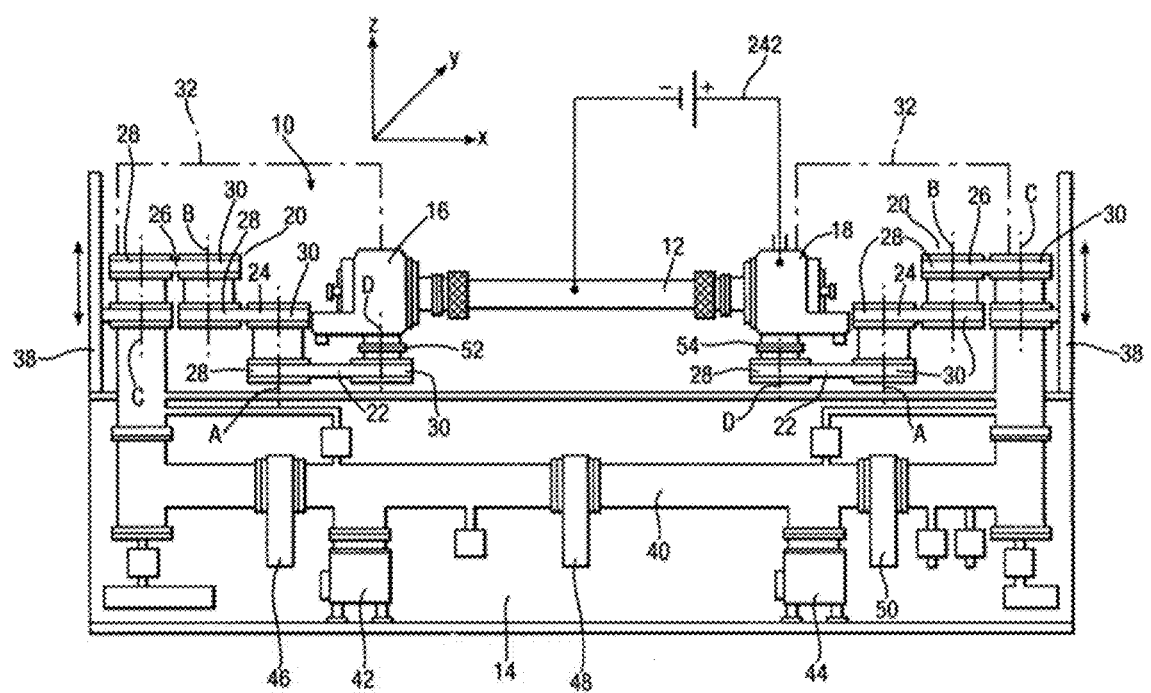
FIG. 2 illustrates the relative positions and interactions between a workpiece and the coupling heads of the system embodiment shown in FIG. 1
Figure 3:
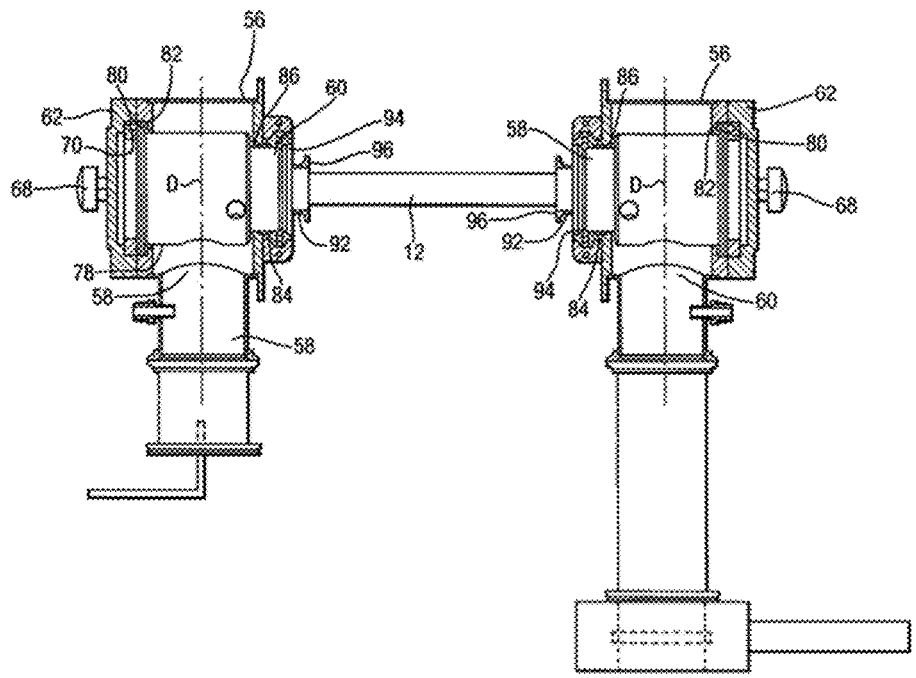
FIG. 3 shows a cross-sectional view of an inlet and outlet coupling head.
Figure 4:
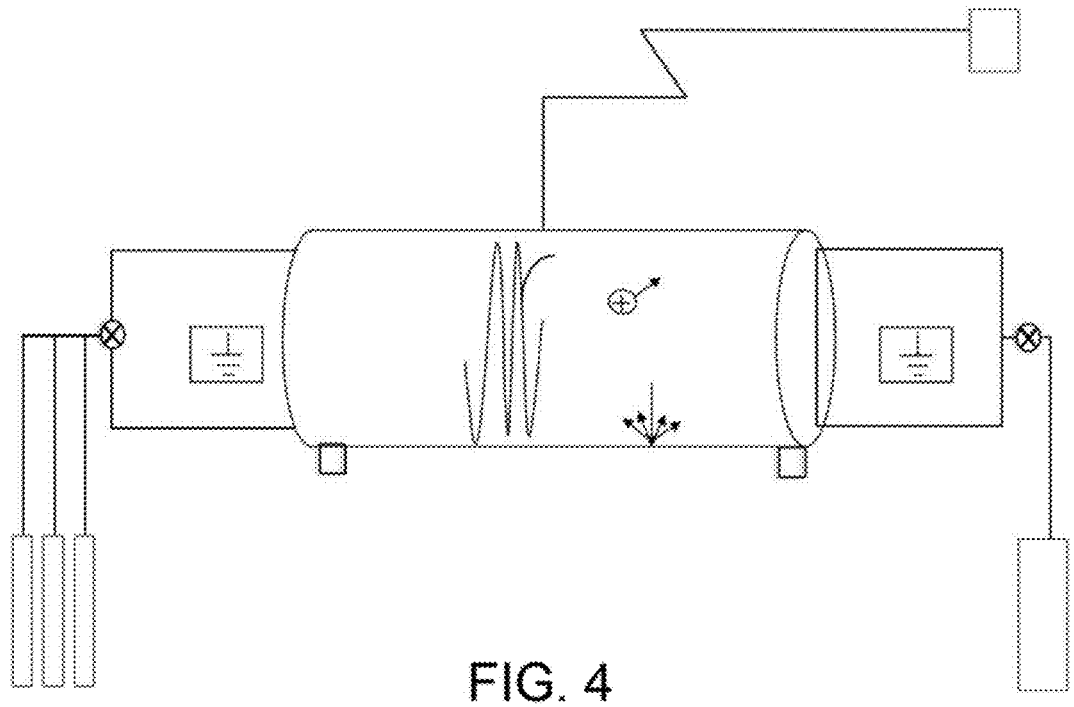
FIG. 4 shows a schematic diagram of cathodes and anodes of the system enabling a hollow cathode condition within an interior space of a chamber.
Figure 5:
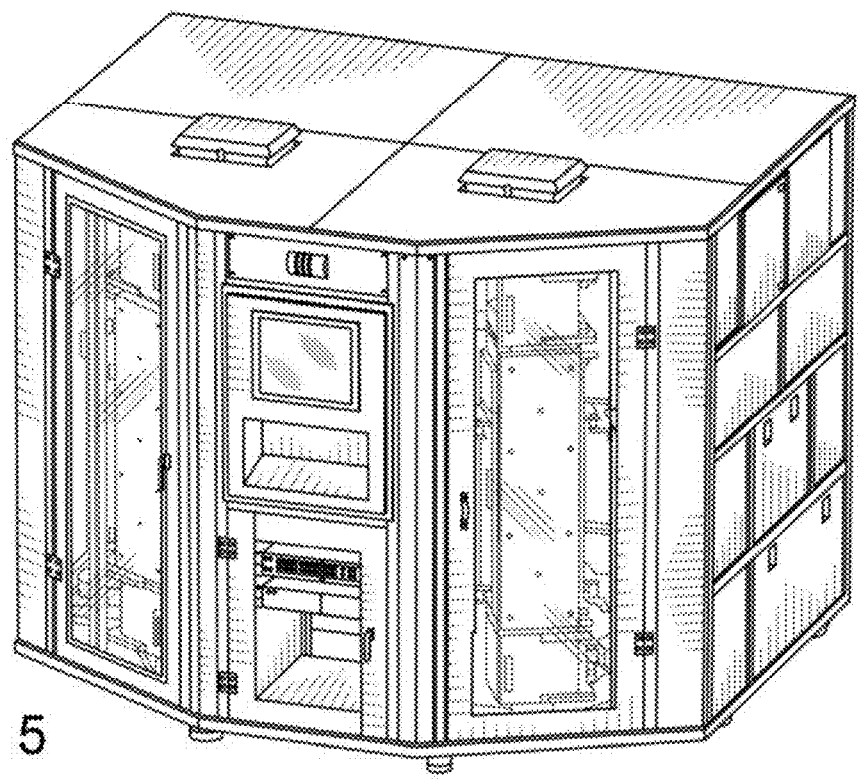
FIG. 5 is another embodiment of the deposition system having multiple chambers and that can perform duplex plasma nitriding and coating onto an interior and exterior surface of a workpiece.
Figure 6:
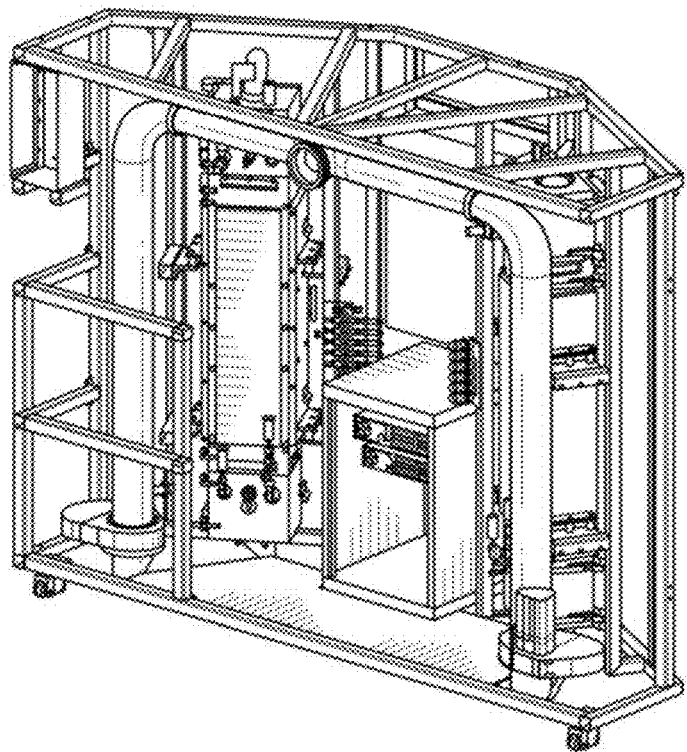
FIG. 6 shows a back interior view of the deposition system according to FIG. 5.
Figure 8:
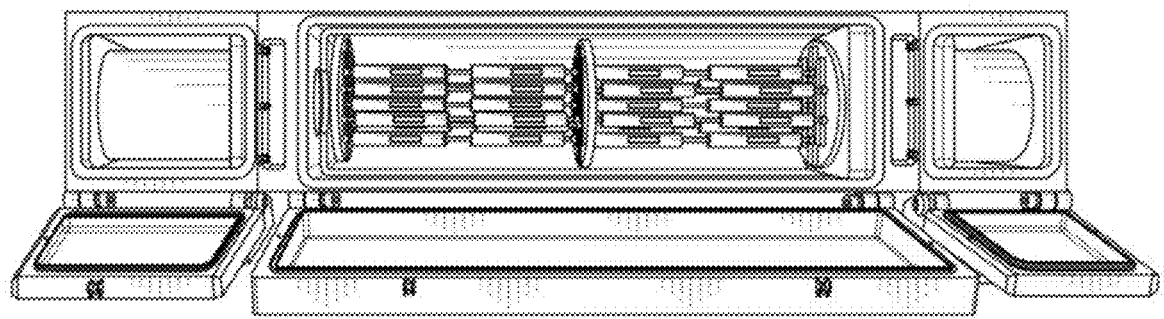
FIG. 8 shows one chamber of the deposition system with a moveable door ajar for accessing workpieces within the chamber.
Figure 7:
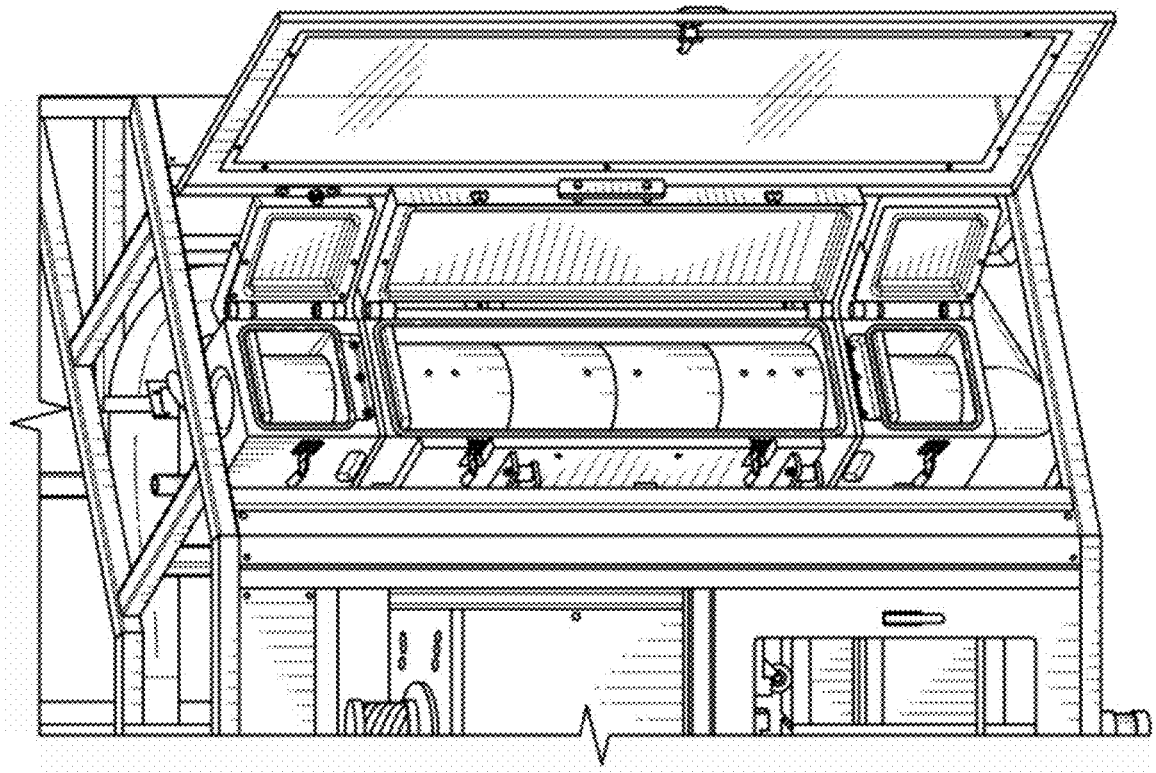
FIG. 7 shows a chamber of the deposition system with the moveable door ajar for loading and unloading workpieces.
Figure 9:
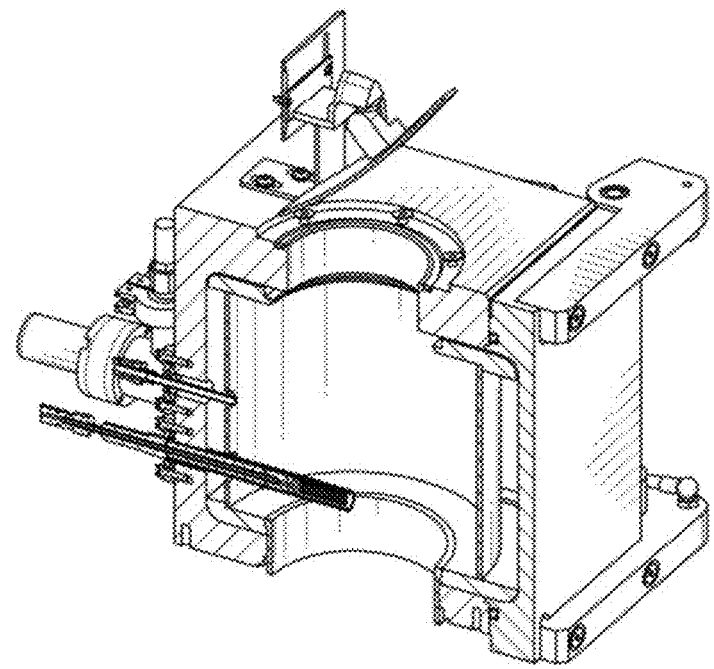
FIG. 9 shows a gas chamber configured to be coupled to a first end of the chamber for delivering gas.
Figure 10:
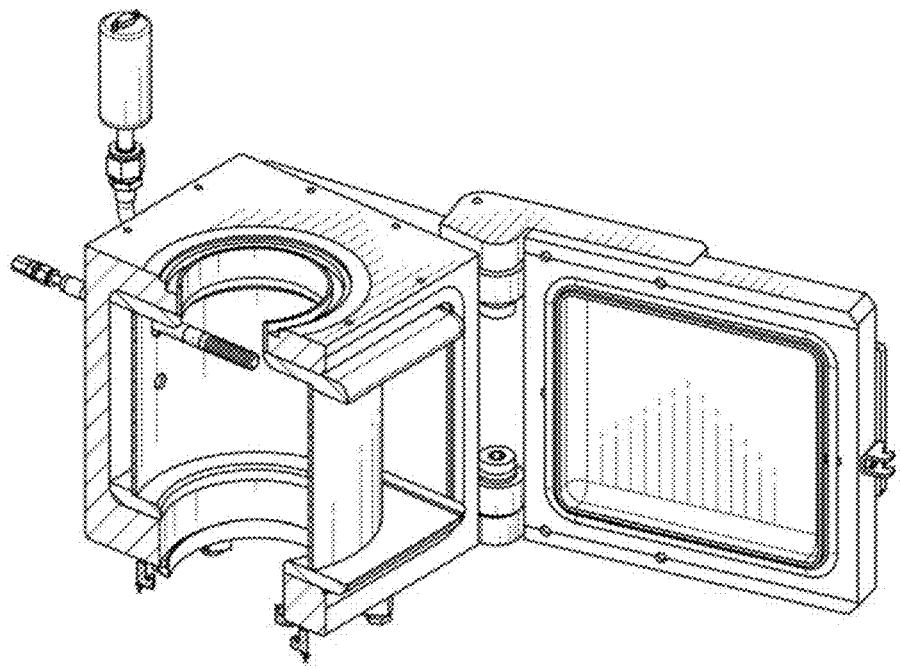
FIG. 10 shows a vacuum head configured to be coupled to an opposing second end of the chamber.
Figure 11:
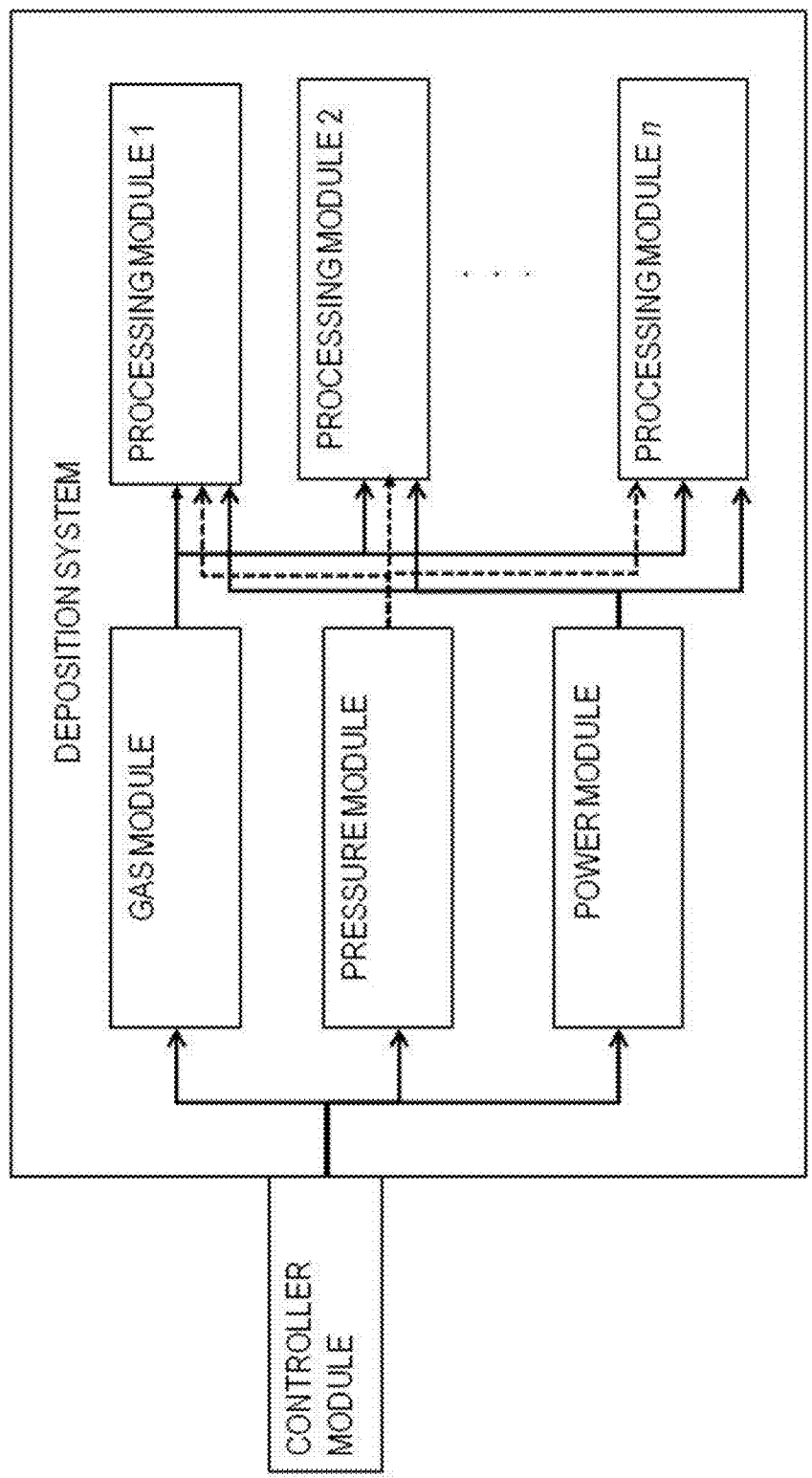
FIG. 11 shows a schematic diagram of the deposition system having a gas module, a pressure module, and a power module coupled to one or more processing modules of the deposition system, and further comprising a controller module for controlling each of the aforementioned modules.

Referring to FIGS. 1-3, the present invention features a system for rapid plasma nitriding of an interior surface of a conductive workpiece. The system preferably utilizes the hollow cathode effect as shown in FIG. 4. In one embodiment, the system comprises a biasing system electrically coupled to the workpiece and an anode so to negatively bias the workpiece relative to an anode, a vacuum source for evacuating an interior of the workpiece that is sealed, while being treated, from an exterior of the workpiece, a gas supply for introducing a gas comprising nitrogen to said interior of the workpiece, a control system for controlling the biasing system, the vacuum source and the gas supply, and one or more coupling heads for sealing the workpiece. Each of the coupling heads may comprise a casing having an inlet for receiving gas from said gas supply and an outlet for connecting with said interior of the workpiece to be treated, and a removable shield at least partially shielding said casing from any gas introduced thereto.

In some embodiments, the system may further comprise a heat shield for controlling a temperature of the workpiece. In other embodiments, the system may further comprise a second gas supply for introducing a gas comprising reactive gases for coating deposition. The system may be further configured to coat the nitrided workpiece with a coating without venting the interior of the workpiece or exposing the workpiece to any contaminant. In one embodiment, the coating may be a diamond like carbon (DLC), silicon carbide, multilayer DLC with silicon based adhesion layer, or a multi-layer DLC with a metal based adhesion layer. In another embodiment, the coating is doped with N, Ge, Si, O, V, Cr, W, Ta, Ti, Co, Al, or a combination thereof. In some embodiments, the system may be further configured to deposit crystalline diamond, either in addition to a first plasma nitriding step or directly on the workpiece itself.

According to some embodiments, the system may be utilized in a method for treating an interior surface of a conductive workpiece. The method may comprise providing the system, cleaning and fixturing the workpiece in preparation for vacuum processing, evacuating an interior of the workpiece to a vacuum pressure, introducing the gas comprising nitrogen and adjusting the pressure for plasma nitriding, and applying a biasing voltage between the workpiece and the anode so as to establish a hollow cathode effect and generate a plasma within said workpiece, thereby plasma nitriding the interior surface of the workpiece. In other embodiments, the method may further comprise depositing a duplex coating onto the nitrided interior surface, comprising introducing a one or more reactive gases for coating deposition, adjusting the pressure, and applying a biasing voltage between the workpiece and the anode so as to establish a hollow cathode effect and generate a plasma within said workpiece, thereby coating the nitrided interior surface.

Referring now to FIGS. 5-11, the present invention features a system for rapid plasma nitriding an interior surface, an external surface, or both of one or more conductive workpieces utilizing the hollow cathode effect. In some embodiments, the system may comprise at least one processing module comprising a chamber having a movable door, a gas module comprising one or more gases comprising nitrogen, hydrogen, argon or a combination thereof, the gas module operably coupled to the processing module and configured to deliver gas to the chamber, a pressure module operably coupled to the processing module and configured to apply a vacuum to the chamber, a power module comprising anodes and a DC power supply operably coupled to the processing module, the power module configured to negatively bias the chamber and workpieces therein as cathodes, and a controller module operably coupled to the processing module, the gas module, the pressure module, and the power module. In one embodiment, the controller has memory that stores computer readable instructions that, when executed by the controller, causes the controller to regulate vacuum in the chamber of the processing module, adjust gas flow to the chamber of the processing module, and apply a negative pulse for biasing the one or more workpieces and the chamber as cathodes to establish hollow cathode conditions, thus generating a plasma of the gas to uniformly nitride the workpieces.

According to other embodiments, the system for rapid plasma nitriding an interior surface, an external surface, or both of one or more conductive workpieces may comprise two or more processing modules, each having a chamber that includes a movable door. Preferably, each processing module may be configured to operate individually such that the chamber of one processing module is independent of the chamber of another processing module. For example, when at least one of the processing modules is processing a set of workpieces positioned within the chamber, the other processing module is available for loading or unloading a second set of workpieces or for receiving maintenance, thereby increasing throughput of the system.

In other embodiments, the system may further include a gas module operably coupled to each of the processing modules and configured to deliver gas comprising one or more gases comprising nitrogen, hydrogen, argon or a combination thereof to only the chamber being used for processing the workpieces, a pressure module operably coupled to each of the processing modules and configured to apply a vacuum to only the chamber being used for processing the workpieces, a power module comprising anodes operably coupled to each of the processing modules and a DC power supply operably coupled to each of the processing modules, the power module configured to negatively bias the chamber and workpieces therein as cathodes, and a controller module operably coupled to the one or more processing modules, the gas module, the pressure module, and the power module. In one embodiment, the controller has memory that stores computer readable instructions that, when executed by the controller, causes the controller to select which processing module is being used for coating the workpieces, regulate vacuum of the chamber of the selected processing module, adjust gas flow to the chamber of the selected processing module, and apply a negative pulse for biasing the one or more workpieces and the chamber as cathodes to establish hollow cathode conditions, thus generating a plasma of the gas to uniformly nitride the workpieces.

Consistent with the systems described herein, the system may further comprise a heat shield for controlling a temperature of the workpiece. As such, the present advantage has the advantage of processing the workpieces at lower temperatures, for example, plasma nitriding at temperatures less than 700° C., e.g. about 400° C.-650° C.

In some embodiments, the one or more gases may further comprise reactive gases for coating deposition. In other embodiments, the system may be further configured to coat the nitrided workpieces with a coating without venting the chamber or exposing the workpieces to any contaminant. In one embodiment, the coating may be a diamond like carbon (DLC), silicon carbide, multilayer DLC with silicon based adhesion layer, or a multi-layer DLC with a metal based adhesion layer. In another embodiment, the coating is doped with N, Ge, Si, O, V, Cr, W, Ta, Ti, Co, Al, or a combination thereof. In some embodiments, the system may be further configured to deposit crystalline diamond, either in addition to the plasma nitriding step or directly on the workpieces.

According to other embodiments, the systems may be used in a method for treating one or more conductive workpieces. The method may comprise providing any of the systems for rapid plasma nitriding an interior surface, an external surface, or both of one or more conductive workpieces, cleaning the workpieces in preparation for vacuum processing, positioning the workpieces inside the chamber, evacuating the chamber to a vacuum pressure, introducing the gas comprising nitrogen into the chamber and adjusting the pressure for plasma nitriding, and applying a biasing voltage between the workpieces and the chamber and the anode so as to establish a hollow cathode effect and generate a plasma, thereby plasma nitriding the surfaces of the workpieces. In some other embodiments, the method may further comprise comprising depositing a duplex coating onto the nitrided surfaces of the workpieces. This duplex coating step may comprise introducing one or more reactive gases for coating deposition, adjusting the pressure, and applying a biasing voltage between the workpieces and the chamber and the anode so as to establish a hollow cathode effect and generate a plasma, thereby coating the nitrided surfaces.

The present invention has been demonstrated to perform rapid plasma nitriding using hollow cathode discharges created with pulsed DC. Pulsed DC allows for fine control of both peak and average power delivered to the system to enable control over plasma uniformity, substrate temperature, and gas composition during pulsing. While straight DC is possible, pulsed DC is preferred for the reasons stated previously as well as its ability to prevent arcing sometimes associated with DC plasmas. RF and pulsed RF discharges are also relevant activation methods, but the power supply and matching networks required are more costly than pulsed DC units and control of voltage bias is limited without additional bias power supplies. Thus, pulsed DC is the preferred method for activation and control of the plasma.

In some embodiments, pulse frequencies may vary from about 10 kHz to about 50 kHz for high frequency pulsing. In other embodiments, pulse frequencies may vary from about 1 Hz to about 100 Hz for low frequency burst of pulse packages or even continuous wave high frequency pulsing. In yet other embodiments, total bias time may vary from about 0.5% and about 75%. For example, common values of total bias time may vary from about 2% and about 50%, or from about 2% and about 25%.

In some embodiments, operating pressures may be about 50 and about 1000 mTorr. In other embodiments, gas concentrations for plasma nitriding may comprise 100% $N_2$ or mixtures containing $H_2$, $N_2$, and Argon at various concentrations. In one embodiment, hydrogen concentration is typically 0-50% and is varied to control the concentration of free nitrogen at the surface.

Example 1

The following is provided as a non-limiting example of implementing the present invention.

Parts are first degreased and typically ultrasonically cleaned to prepare them for vacuum processing. In one embodiment, for coating an internal surface, the parts are fixtured for vacuum processing and are turned into a vacuum chamber and evacuated. In an alternative embodiment, for coating an internal surface, an external surface, or both the internal and external surface simultaneously, the parts are fixtured for vacuum processing and are loaded onto fixtures and into a reusable vacuum chamber and evacuated. After ensuring a good vacuum, the parts are first treated with a plasma containing a mixture of Hydrogen and Argon to clean and activate the surface. The gas composition is then altered to introduce nitrogen and the pressure adjusted to the operating pressure for plasma nitriding.

In some embodiments, if a duplex coating is requested, rather than air or argon quench, the surface is briefly bombarded with Argon plasma before introducing the desired reactive gases for coating deposition. For DLC, this can include a carbon source such as methane, acetylene, or other carbon source. For enhanced adhesion, a silicon containing bridge/adhesion layer may be used through introduction of a gas such as tetramethylsilane, silane, or other. Additionally, metal based adhesion layers can be created using titanium tetrachloride, tetrakis(dimethylamino)titanium(IV), or others.

According to some embodiments, the present invention may be used to surface harden automotive parts via plasma nitriding. In conjunction, the addition of a duplex DLC coating using the same system can greatly reduce wear and friction, thereby enhancing part lifetime while also increasing the efficiency of the engine. In addition to automotive applications, the present invention may be implemented in the tool cutting industry, aerospace, oil and gas, agriculture, heavy industrial equipment, weapons, etc. According to some other embodiments, the systems of the present invention may be used to create crystalline diamond at higher rates than has previously been achieved.

As used herein, the term "about" refers to plus or minus 10% of the referenced number.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

What is claimed is:

1. A system for rapid plasma nitriding an interior surface, an external surface, or both of one or more conductive workpieces utilizing the hollow cathode effect, the system comprising:
   a. at least one processing module comprising a conductive chamber, wherein the conductive chamber includes a movable door;
   b. a gas module comprising a plasma nitriding gas comprising $N_2$, the gas module operably coupled to the processing module and configured to deliver the plasma nitriding gas to the chamber;
   c. a pressure module operably coupled to the processing module and configured to apply a vacuum to the chamber;
   d. a power module comprising anodes and a DC power supply operably coupled to the processing module, wherein the power module is configured to negatively bias the chamber and workpieces therein as cathodes; and
   e. a controller module operably coupled to the processing module, the gas module, the pressure module, and the power module, wherein the controller module has memory that stores computer readable instructions that, when executed by the controller module, causes the controller module to:
      i. regulate vacuum in the chamber of the processing module;
      ii. adjust gas flow of the plasma nitriding gas to the chamber of the processing module; and
      iii. apply a negative pulse for biasing the one or more workpieces and the chamber as cathodes to establish hollow cathode conditions, thus generating a plasma of the plasma nitriding gas to uniformly nitride the workpieces.

2. The system of claim 1 further comprising a heat shield for controlling a temperature of the workpieces.

3. The system of claim 1 further configured to coat the nitrided workpieces with a coating without venting the chamber or exposing the workpieces to any contaminant.

4. The system of claim 3, wherein the gas module further comprises reactive gases for coating deposition.

5. The system of claim 3, wherein the coating is a diamond like carbon (DLC), silicon carbide, multilayer DLC with silicon based adhesion layer, or a multi-layer DLC with a metal based adhesion layer.

6. The system of claim 3, wherein the coating is doped with N, Ge, Si, O, V, Cr, W, Ta, Ti, Co, Al, or a combination thereof.

7. The system of claim 1 further configured to deposit crystalline diamond either in addition to the plasma nitriding step or directly on the workpieces.

8. A method for treating an interior surface, an external surface, or both of one or more conductive workpieces, said method comprising:
   a. providing the system according to claim 1;
   b. cleaning the workpieces in preparation for vacuum processing;
   c. positioning the workpieces inside the chamber;
   d. evacuating the chamber to a vacuum pressure;
   e. introducing the plasma nitriding gas comprising $N_2$ into the chamber and adjusting the pressure for plasma nitriding; and
   f. applying a biasing voltage between the workpieces and the chamber and the anode so as to establish a hollow cathode effect and generate a plasma, thereby plasma nitriding the surfaces of the workpieces.

9. The method of claim 8 further comprising depositing a duplex coating onto the nitrided surfaces of the workpieces, comprising introducing one or more reactive gases for coating deposition, adjusting the pressure, and applying a biasing voltage between the workpieces and the chamber and the anode so as to establish a hollow cathode effect and generate a plasma, thereby coating the nitrided surfaces.

10. A system for rapid plasma nitriding an interior surface, an external surface, or both of one or more conductive workpieces utilizing the hollow cathode effect, the system comprising:
   a. two or more processing modules, each comprising a conductive chamber, wherein the conductive chamber includes a movable door, wherein each processing module is configured to operate individually such that the chamber of one processing module is independent of the chamber of another processing module, wherein when at least one of the processing modules is processing a first set of workpieces positioned within the chamber, the other processing module is available for loading or unloading a second set of workpieces or for receiving maintenance, thereby increasing throughput of the system;
   b. a gas module comprising a plasma nitriding gas comprising $N_2$, the gas module operably coupled to the processing module and configured to deliver the plasma nitriding gas only to the chamber being used for processing the workpieces;
   c. a pressure module operably coupled to each of the processing modules, configured to apply a vacuum only to the chamber being used for processing the workpieces;
   d. a power module comprising anodes operably coupled to each of the processing modules and a DC power supply operably coupled to each of the processing modules, wherein the power module is configured to negatively bias the chamber and workpieces therein as cathodes; and
   e. a controller module operably coupled to the two or more processing modules, the gas module, the pressure module, and the power module, wherein the controller module has memory that stores computer readable instructions that, when executed by the controller module, causes the controller module to:
  i. select which processing module is being used for coating the workpieces;
  ii. regulate vacuum of the chamber of the selected processing module;
  iii. adjust gas flow of the plasma nitriding gas to the chamber of the selected processing module; and
  iv. apply a negative pulse for biasing the one or more workpieces and the chamber as cathodes to establish hollow cathode conditions, thus generating a plasma of the plasma nitriding gas to uniformly nitride the workpieces.

11. A method for treating an interior surface, an external surface, or both of one or more conductive workpieces, said method comprising:
  a. providing the system according to claim 10;
  b. cleaning the workpieces in preparation for vacuum processing;
  c. positioning the workpieces inside the chamber;
  d. evacuating the chamber to a vacuum pressure;
  e. introducing the plasma nitriding gas comprising $N_2$ into the chamber and adjusting the pressure for plasma nitriding; and
  f. applying a biasing voltage between the workpieces and the chamber and the anode so as to establish a hollow cathode effect and generate a plasma, thereby plasma nitriding the surfaces of the workpieces.

12. The system of claim 10 further comprising a heat shield for controlling a temperature of the workpieces.

13. The system of claim 10 further configured to coat the nitrided workpieces with a coating in the chamber being used for processing the workpieces, without venting said chamber or exposing the workpieces to any contaminant.

14. The system of claim 13, wherein the gas module further comprises reactive gases for coating deposition.

15. The system of claim 13, wherein the coating is a diamond like carbon (DLC), silicon carbide, multilayer DLC with silicon based adhesion layer, or a multi-layer DLC with a metal based adhesion layer.

16. The system of claim 13, wherein the coating is doped with N, Ge, Si, O, V, Cr, W, Ta, Ti, Co, Al, or a combination thereof.

17. The system of claim 10 further configured to deposit crystalline diamond either in addition to the plasma nitriding step or directly on the workpieces.

* * * * *